United States Patent
Asplund

[11] Patent Number: 5,999,388
[45] Date of Patent: *Dec. 7, 1999

[54] METHOD AND APPARATUS FOR LIMITING CURRENT IN A DIRECT VOLTAGE NETWORK OF A POWER TRANSMISSION SYSTEM

[75] Inventor: Gunnar Asplund, Ludvika, Sweden

[73] Assignee: Asea Brown Boveri AB, Vasteras, Sweden

[ * ] Notice: This patent issued on a continued prosecution application filed under 37 CFR 1.53(d), and is subject to the twenty year patent term provisions of 35 U.S.C. 154(a)(2).

[21] Appl. No.: 08/931,161

[22] Filed: Sep. 16, 1997

[30] Foreign Application Priority Data

Mar. 24, 1997 [SE] Sweden .................................. 9701065

[51] Int. Cl.$^6$ ....................................................... H02H 9/00
[52] U.S. Cl. ............................ 361/58; 361/101; 323/908; 363/51
[58] Field of Search .................................. 361/58, 101, 3, 361/5–11, 57, 111, 117–118, 126–128, 130–131, 93–98; 323/908; 363/35, 51, 127

[56] References Cited

U.S. PATENT DOCUMENTS

| | | |
|---|---|---|
| 4,174,495 | 11/1979 | Rosa ........................................ 323/326 |
| 4,665,458 | 5/1987 | Matsuoka et al. ........................ 361/18 |
| 4,698,736 | 10/1987 | Higa .......................................... 363/51 |
| 4,941,079 | 7/1990 | Ooi .......................................... 363/132 |
| 5,216,352 | 6/1993 | Studtmann et al. ..................... 323/241 |
| 5,233,495 | 8/1993 | De Palma et al. ........................... 361/3 |
| 5,317,499 | 5/1994 | Brakus ...................................... 363/56 |
| 5,561,579 | 10/1996 | Gyugyi et al. .......................... 361/100 |
| 5,650,904 | 7/1997 | Gilley et al. .............................. 361/56 |

*Primary Examiner*—Michael J. Sherry
*Attorney, Agent, or Firm*—Pollock, Vande Sande & Amernick

[57] ABSTRACT

Apparatus and method for limiting current in a direct voltage network of a HVDC power distribution system. A direct voltage network is connected to an alternating voltage network through a VSC-converter. At least one parallel connection including a semiconductor switching element is connected in series with the direct voltage network. A surge diverter is connected in parallel with the semiconductor switching element. During a high current condition in the direct voltage network, the switching element is switched off interrupting the current flow which is then diverted through the surge diverter which reduces the current flowing in the direct voltage network. By inserting a plurality of parallel connections, and selectively turning off a number of the semiconductor switching elements, a number of different levels of over current conditions in the direct voltage network may be controlled.

16 Claims, 2 Drawing Sheets

NUMBER OF SEMICONDUCTOR
ELEMENTS 14
TURNED OFF

METHOD AND APPARATUS FOR LIMITING CURRENT IN A DIRECT VOLTAGE NETWORK OF A POWER TRANSMISSION SYSTEM

BACKGROUND OF THE INVENTION

The present invention relates to a plant for transmitting electric power comprising a direct voltage network for High Voltage Direct Current (HVDC) and at least one alternating voltage network connected thereto through a station. The station transmits electric power between the direct voltage network and the alternating voltage network, and comprises at least one VSC-converter to convert direct voltage into alternating voltage, and conversely, to convert alternating voltage into direct voltage.

Such a plant has recently been known through the thesis "PWM and Control of Two and Three Level High Power Voltage Source Converters" by Anders Lindberg, Kungliga Tekniska Hogskolan, Stockholm, 1995. This publication describes such a plant for transmitting electric power through a direct voltage network for High Voltage Direct Current (HVDC). Before issuance of this thesis, plants for transmitting electric power through a direct voltage network for High Voltage Direct Current have made use of line-commutated CSC (Current Source Converter) converters in power transmission stations. Since the development of IGBTs (Insulated Gate Bipolar Transistor=bipolar transistor having an insulated gate) for high voltage applications, and the suitability of connecting them in series in valves of converters; and since they may easily be turned on and turned off simultaneously; VSC (Voltage Source Converter) converters for forced commutation are now a viable alternative. This type of transmission of electric power between a direct voltage network for High Voltage Direct Current, and alternating voltage networks, offers several important advantages with respect to the use of line-commutated CSCs in HVDC applications. The consumption of active and reactive power may be controlled independently of each other, and there is no risk of commutation failures in the converter and thereby no risk of transmission of commutation failures between different HVDC links, which occur in a line-commutated CSC. Furthermore, there now exists the possibility of feeding a weak alternating voltage network, or a network without generation capability of its own (a dead alternating voltage network). Further advantages also exist.

However, in this new type of plant, having no transformers, there is a requirement to rapidly limit the current in the direct voltage network, and also to quickly interrupt the current, since the alternating voltage network is directly connected to the direct voltage network through the VSC-converter. This may mean that very high currents are suddenly directed into the direct voltage network when for example, a ground fault occurs. It is often not an acceptable solution to arrange mechanical breakers in the direct voltage network, since the breaker may not be tripped in time to avoid damaging high currents.

BRIEF SUMMARY OF THE INVENTION

The object of the present invention is to provide a plant in which the above problems have been solved in a satisfactory way.

The object of the invention is obtained by at least one parallel connection of at least one semiconductor element of the turn-off type and a surge diverter in the direct voltage network of such a plant.

By having such a parallel connection in the direct voltage network, the current through the direct voltage network may be very rapidly limited, since such a semiconductor element may be turned off very rapidly, should there be a need for interrupting current through the direct voltage network. The surge diverter is suitably dimensioned by selecting the voltage level at which it becomes conducting to lower the current. The current in the direct voltage network may also be interrupted by turning the parallel connection semiconductor element off to further lower the current. The electric energy absorbed by the parallel connection will be substantially absorbed by the surge diverter, and the semiconductor element will be protected against over currents.

According to a preferred embodiment of the invention, the plant is of such a type that the current through the direct voltage network may assume two possible directions, and there are two parallel connection elements connected in series, with oppositely directed conducting directions, and a separate rectifier diode connected anti-parallel with each of the semiconductor elements. Such a parallel connection of semiconductor elements, rectifier diodes and surge diverter in the direct voltage network safely provides the advantageous current limiting and current interrupting function. This is true for the case in which the current direction in the direct voltage network at a given instant is not known, which may be the case in a so-called "meshed" network. Thus, in such a case turning on or turning off of the two semiconductor elements takes place simultaneously.

According to another preferred embodiment of the invention, the plant comprises an apparatus to turn the semiconductor elements of the parallel connection off when the direct voltage network current exceeds a predetermined level. At least a current limitation in the direct voltage network takes place, and depending upon the voltage thereacross and the dimensioning of the surge diverter, the current is interrupted.

According to another preferred embodiment of the invention, the apparatus, when the current in the direct voltage network exceeds a predetermined level, starts to alternately turn the semiconductor elements of the parallel connection off and on at a frequency which adjusts the current in the direct voltage network to reduce the current to a maximum level. By alternate switching of the semiconductor elements off and on, the current in the direct voltage network may be adjusted to a desired level and restricted in a desired way. The intensity of the current will depend upon the relationship between the lengths of turn-off and turn-on times for the semiconductor elements of the parallel connection.

According to another preferred embodiment of the invention the plant comprises a plurality of parallel connections in the direct voltage network. By arranging a plurality of such parallel connections and appropriately activating a number of the parallel connections, it will be possible to limit the current through the direct voltage network to different levels and by turning a sufficient number of semiconductor elements off, completely interrupting the current.

According to another preferred embodiment of the invention, which constitutes a further development of the previous embodiment, the apparatus alternately turns the different semiconductor elements on and off when the current in the direct voltage network exceeds a predetermined level. The on and off sequence constitutes a pattern for adjusting the current through the direct voltage network which is determined by the extent to which the current exceeds a predetermined maximum level. The current in the direct voltage network may, with high reliability, be kept below a maximum level. By alternately turning the semiconductor elements on and off, the semiconductor elements as well as the surge diverter conduct current, and the large amount of electric energy which may be transmitted to the direct voltage network, for example from a ground fault, may be taken care of by the surge diverters.

According to another preferred embodiment of the invention, the apparatus, when the current in the direct voltage network exceeds a predetermined level, turns a large number of semiconductor elements off interrupting the current, and the corresponding number of surge diverters manage to absorb the voltage to be taken by the direct voltage network. By turning a sufficiently large number of semiconductor elements off in this way, in a plant having a plurality of said parallel connections connected in the direct voltage network, a very fast interruption of the current in the direct voltage network is achieved, should this be necessary in cases of lengthy faults.

According to another preferred embodiment of the invention, the apparatus carries out the turning on and off at a kHz rate. It is advantageous to switch the semiconductor elements on and off to obtain an appropriate current limiting effect with a frequency that is substantially the same as the control frequency for the semiconductor elements in the current valves of the VSC-converter. This means that the apparatus may follow the VSC-converter and may restrict the current through the high voltage network to an appropriate current level.

Further advantages as well as advantages of features of the invention will appear from the following description and the claims.

DETAILED DESCRIPTION OF THE PREFERRED EMBODIMENT OF THE INVENTION

Figure 1:
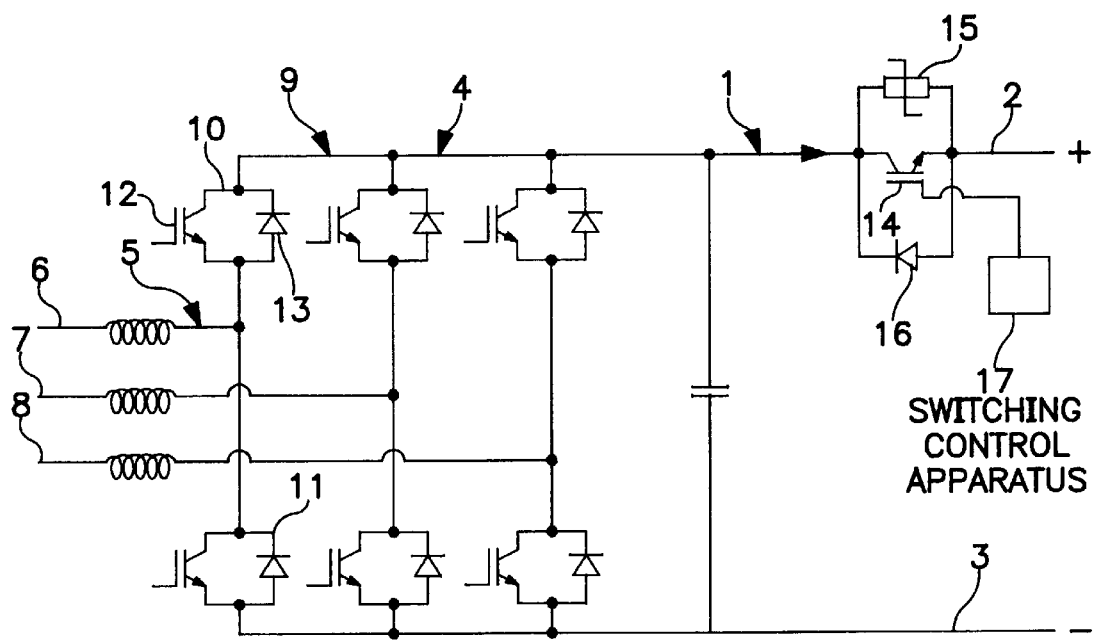
FIG. 1 is a schematic diagram of a part of a plant according to a first preferred embodiment of the invention.

The structure of a plant for transmitting electric power according to a first preferred embodiment of the invention is schematically illustrated in FIG. 1. Only the components which are directly related to the function according to the invention have been shown in the drawing so as to facilitate the understanding of the invention.

The plant comprises a direct voltage network 1 for High Voltage Direct Current (HVDC=High Voltage Direct Current) having two pole conductors or lines 2, 3, and an alternating voltage network 5 connected to the direct voltage network through a station. The alternating voltage network has, in the present case, three phases 6, 7, 8.

The station is designed to perform transmission of electric power between the direct voltage network 1 and the alternating voltage network 5. Power may be fed in from the alternating voltage network to the direct voltage network, or fed out from the direct voltage network to the alternating voltage network. Thus, the alternating voltage network may have generators of electric power, or only be connected to power consumers.

The station comprises at least one VSC-converter 9 adapted to convert direct voltage into alternating voltage, and conversely alternating voltage into direct voltage. However, it is completely possible that the station comprises a plurality of such converters. The VSC-converter comprises, in a conventional way, one phase leg for each phase with two so-called current valves 10, 11, which includes branches of turn-on and turn-off type breakers 12 preferably in the form of IGBTs, connected in series, and diodes 13 connected anti-parallel therewith. A large number of IGBTs may be connected in series to form a single valve, and simultaneously turned on and turned off so as to function as a single breaker. The voltage across the valve is distributed among the different breakers connected in series. The control of the breakers takes place in a conventional way by pulse width modulation (PWM).

The plant comprises a parallel connection of a semiconductor switching element 14 having an ability to interrupt the current therethrough, such as an IGBT, GTO, MOSFET etc., and a surge diverter 15, connected in the direct voltage network. A rectifier diode 16 is connected anti-parallel to the semiconductor switching element 14.

In the case of a plant of this type having two pole conductors of the direct voltage network, the second pole conductor also has such a parallel connection, although it is not shown in FIG. 1. The surge diverter 15 is of a conventional type, such as a zinc oxide diverter, and it normally conducts a very low current, but when the voltage exceeds a certain level, it will conduct a strongly increased current. The plant comprises also an apparatus 17 to detect the current in the direct voltage network 1 and turn the semiconductor element 14 off when the current therethrough exceeds a predetermined level. In normal operation the semiconductor element 14 will be turned on, but when any fault occurs in the plant, such as a ground fault in the direct voltage network, and the voltage drop over the direct voltage network is large with a risk of high currents therethrough, apparatus 17 begins to alternately turn the semiconductor elements 14 on and off at a comparatively high frequency (in the range of kHz). The current I through the direct voltage network will be commutated between the semiconductor element 14 and the surge diverter 15, and a current limiting effect will be obtained. The intensity of the resulting current will depend upon the relationship between the lengths of the turn-off times and turn-on times of the semiconductor switching element 14. Depending upon the existing voltages and the dimension of the surge diverter 15, it is possible that the apparatus 17 may interrupt the current I in the direct voltage network by placing the semiconductor element 14 in a permanently off state.

Figure 2:
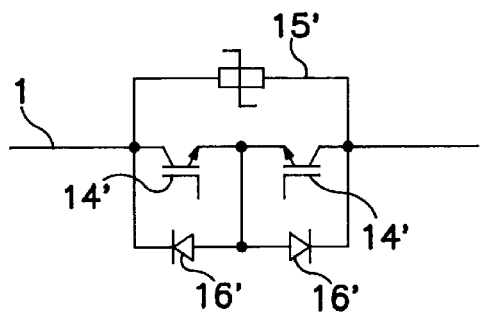
FIG. 2 is a diagram of a portion of a plant according to a second preferred embodiment of the invention.

An alternative to the parallel connection shown in FIG. 1 is shown in FIG. 2, which differs from that according to FIG. 1 by the presence of two semiconductor switching elements 14' connected in series with oppositely directed conducting directions, and a separate rectifier diode 16' connected in anti-parallel with each of the semiconductor switching elements. It is intended that the semiconductor elements 14' and 14' shall be simultaneously turned off and turned on, which makes it possible to obtain the current limiting function of the parallel connection of FIG. 1 irrespective of the direction of the current in the direct voltage network 1. A parallel connection of this type is arranged in so-called meshed networks where the current through the direct voltage network may assume one of two possible directions which is usually unknown.

Figure 3:
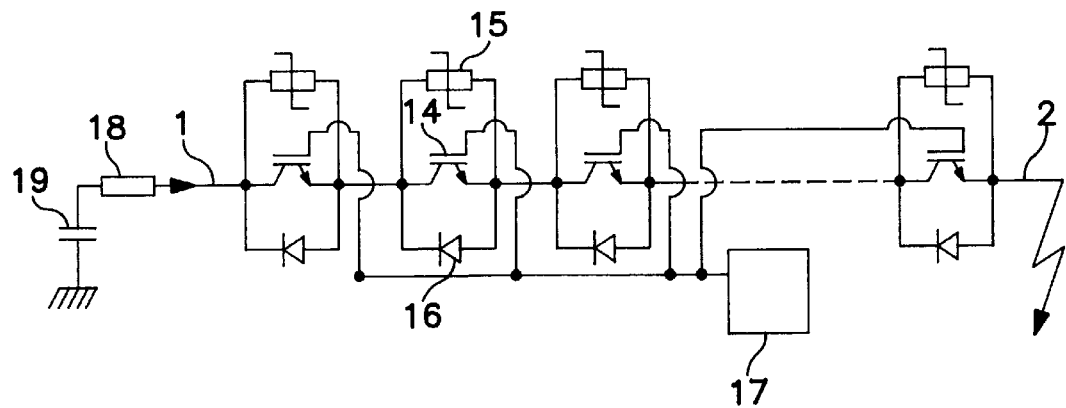
FIG. 3 is a diagram simplified with respect to FIG. 1 of a portion of a plant according to a third preferred embodiment of the invention.

A plant according to a third preferred embodiment of the invention is illustrated in FIG. 3, which is slightly simplified with respect to FIG. 1. The real difference between this plant and that according to FIG. 1 is that the plant in FIG. 3 has a plurality of parallel connections of semiconductor elements 14 and surge diverters 15, and rectifier diodes 16 connected antiparallel thereto in the direct voltage network. The total resistance of the system has also been illustrated by resistor 18. The direct voltage network in this plant has only one pole conductor 2. The voltage $U_d$ of the direct voltage network lies across capacitor 19. When a fault such as a ground fault (schematically indicated) occurs, the voltage over the direct voltage network between the station and the ground fault will be very high, and when semiconductor elements 14 are turned on the resistance of the system in principle is represented by the resistor 18. The apparatus 17, alternately, at a high frequency, turns the different semiconductor elements on and off according to a predetermined pattern, depending upon the magnitude of the voltage, and by that the over current, to limit the current through the direct voltage network to an acceptable level. By simultaneously turning a sufficiently large number of semiconductor elements off, the current through the direct voltage network may also be completely interrupted.

Figure 4:
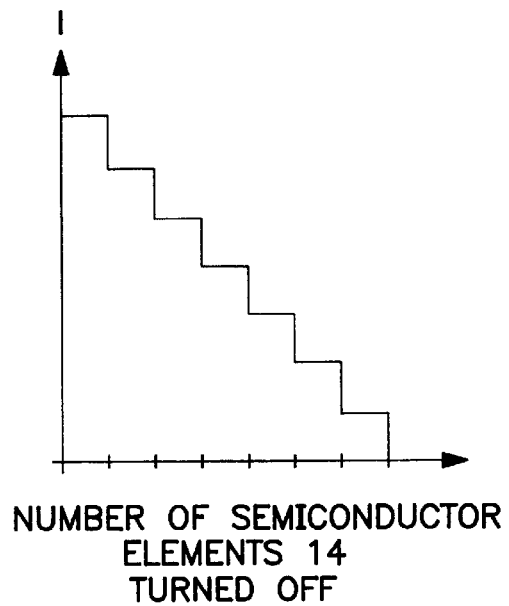
FIG. 4 is a graph illustrating the current through the direct voltage network in the plant according to FIG. 3 as a function of the number of semiconductor elements turned off.

FIG. 4 illustrates how the current I through the direct voltage network is changed as a function of the number of semiconductor elements turned off at the same time. When no semiconductor elements are turned off, the current is equal to the voltage $U_d/R$, in which R is the resistance of the resistor 18. Thus, in the case shown in FIG. 4, a simultaneous turning off of seven semiconductor elements would be required so as to completely interrupt the current in the direct voltage network.

The parallel connections according to the invention are preferably controlled so that they limit the current during certain transient fault cases, but if these fault cases remain, they interrupt the current. These parallel connections would most often be arranged in the stations to be controlled by the control apparatus which controls the converter of the station, but it is also within the scope of the invention to arrange them within the direct voltage network, especially in so-called Meshed networks.

The type of parallel connection illustrated in FIG. 2 may also for example be used in a plant of the type shown in FIG. 3 in so-called meshed networks.

The invention is of course not in any way restricted to the preferred embodiment described above, but many possible modifications thereof would be apparent to one skilled in the art without departing from the basic idea of the invention defined by the claims.

The foregoing description of the invention illustrates and describes the present invention. Additionally, the disclosure shows and describes only the preferred embodiments of the invention, but as aforementioned, it is to be understood that the invention is capable of use in various other combinations, modifications, and environments and is capable of changes or modifications within the scope of the inventive concept as expressed herein, commensurate with the above teachings, and/or the skill or knowledge of the relevant art. The embodiments described hereinabove are further intended to explain the best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. A current limiting apparatus for a direct voltage network of an HVDC system which is connected through a VSC-converter to an alternating voltage network, comprising:

at least a first semiconductor switching element which can be electronically turned on or off connected in series with said direct voltage network; and a surge diverter connected in parallel with said switching element, said surge diverter being connected in series with said direct voltage network and absorbing excess current in normal operation, and dissipating power flowing through said direct voltage network when said switching element is switched to a permanently off state in response to a high current condition thereby reducing current through said direct voltage network.

2. The current limiting apparatus of claim 1 further comprising:

a second semiconductor switching element which can be electronically turned on or off connected in series with said first switching element, so that said series connection of the first and second switching elements are connected in parallel with said surge diverter, said first and second switching elements conducting current in opposite directions when in the on state;

a first diode connected in anti-parallel with said first switching element to conduct current in the same direction as said second switching element;

a second diode connected in anti-parallel with said second switching element to conduct current in the same direction as said first switching element whereby simultaneously turning off said first and second semiconductor switching elements interrupts current through said direct voltage network regardless of the direction of flow of said current.

3. The current limiting apparatus of claim 1 further comprising:

means for turning off said first semiconductor switching element when current through the network exceeds a predetermined level.

4. The current limiting apparatus of claim 3 wherein said means for turning off said first semiconductor switching element alternately turns said first semiconductor switching element on and off alternately interrupting current flowing in said first semiconductor switching element to restore a current flowing through said direct voltage network to a desired level.

5. The current limiting apparatus according to claim 4 wherein said means switches said semiconductor switching elements on and off in a pattern according to a level of current which exceeds a predetermined limit of current.

6. The current limiting apparatus of claim 1 further comprises a diode connected in anti-parallel with said first semiconductor element for carrying current in a reverse direction from current carried by said first semiconductor element.

7. A current limiting apparatus for a direct voltage network of an HVDC system which is connected through a VSC-converter to an alternating voltage network, comprising:

a first semiconductor switching element connected in series with said direct voltage network;

a first diode connected in anti-parallel with said first semiconductor switching element to carry current in an opposite direction of said first semiconductor switching element;

a second semiconductor switching element connected in series with said first semiconductor switching element and said first diode;

a second diode connected in parallel with said second semiconductor switching element to carry current in an opposite direction of said second semiconductor switching element; and a surge diverter connected in parallel with said first and second semiconductor switching elements and said first and second diodes, said semiconductor switching elements providing permanent interruption of said current when excessive current is flowing in either of first or second directions in said direct voltage network, diverting current through said surge diverter dissipating an excessive current.

8. The current limiting apparatus of claim 7 further comprising:

means for determining an excessive current flowing in said direct voltage network; and means for switching said semiconductor switching elements off when said excessive current is flowing in said direct voltage network.

9. A current limiting apparatus for a direct voltage network of an HVDC system which is connected through a VSC-converter to an alternating voltage network, comprising:

a plurality of parallel circuits connected in series with said direct voltage network, each of said parallel circuits comprising a semiconductor switching element connected in parallel with a surge diverter;

means for determining when the current in said direct voltage network exceeds a predetermined level; and means for switching a number of said semiconductor switching elements off, depending on the level of current which exceeds said predetermined level, thereby inserting a number of said surge diverters in said direct voltage network reducing said current level below said predetermined level.

10. The current limiting apparatus according to claim 9, wherein said means for switching alternately switches said semiconductor switching elements off and on to reduce said current level below said predetermined level.

11. A method for reducing the current in a direct voltage network of an HVDC system connected to an alternating voltage network through a VSC-converter comprising:

connecting a series of parallel circuits in said direct voltage network, each of said parallel circuits comprising a semiconductor switching element connected in parallel with a surge diverter;

measuring the current flowing through said direct voltage network; and turning at least one of said semiconductor switching elements permanently off when said current exceeds a predetermined level while maintaining some of said semiconductor switching elements on whereby said surge diverter reduces said current to a level below said predetermined level.

12. The method for reducing current according to claim 11 wherein said at least one semiconductor element is alternately turned off and on when said current exceeds said predetermined level.

13. A method for reducing the current in a direct voltage network of an HVDC system connected to an alternating voltage network through a VSC-converter comprising:

permanently interrupting current flowing at a plurality of locations in said direct voltage network;

diverting said current at said plurality of locations through a plurality of surge diverters whereby said current through said direct voltage network is reduced.

14. The method according to claim 13 wherein said current is interrupted on a pulsed basis.

15. A method for reducing the current in a direct voltage network of an HVDC system connected to an alternating voltage network through a VSC-converter comprising:

connecting a series of parallel circuits in said direct voltage network, each of said parallel circuits comprising a semiconductor switching element connected in parallel with a surge diverter;

measuring the current flowing through said direct voltage network; and turning at least one of said semiconductor switching elements permanently off when said current exceeds a predetermined level while maintaining some of said semiconductor switching elements on, whereby said surge diverter reduces said current to a level below said predetermined level wherein a number of a said semiconductor elements of a plurality of said parallel circuits are switched off, said number being a function of the level of said current which exceeds said predetermined level.

16. A method for reducing the current in a direct voltage network of an HVDC system connected to an alternating voltage network through a VSC-converter comprising:

interrupting current flowing at a number of locations in said direct voltage network which are proportional to the amount of current reduction which is required to reduce said current to a predetermined level; and diverting said current at said number of locations through a plurality of surge diverters whereby said current through said direct voltage network is reduced.

* * * * *